United States Patent
Carmean et al.

(10) Patent No.: US 9,864,005 B1
(45) Date of Patent: Jan. 9, 2018

(54) WAVE-PIPELINED LOGIC CIRCUIT SCANNING SYSTEM

(71) Applicants: Douglas Carmean, Seattle, WA (US); Burton J. Smith, Seattle, WA (US)

(72) Inventors: Douglas Carmean, Seattle, WA (US); Burton J. Smith, Seattle, WA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 15/253,544

(22) Filed: Aug. 31, 2016

(51) Int. Cl.
*G01R 31/28* (2006.01)
*G01R 31/3177* (2006.01)
*G01R 31/317* (2006.01)

(52) U.S. Cl.
CPC ... *G01R 31/3177* (2013.01); *G01R 31/31723* (2013.01); *G01R 31/31727* (2013.01)

(58) Field of Classification Search
None
See application file for complete search history.

(56) References Cited

U.S. PATENT DOCUMENTS

| | | | | |
|---|---|---|---|---|
| 5,337,321 A | * | 8/1994 | Ozaki | G01R 31/31725 714/731 |
| 5,528,177 A | * | 6/1996 | Sridhar | G06F 7/00 326/113 |
| 7,464,282 B1 | * | 12/2008 | Abdollahi-Alibeik | G11C 7/22 713/400 |
| 8,472,278 B2 | * | 6/2013 | Haass | G01R 31/31704 365/233.1 |
| 2002/0069384 A1 | * | 6/2002 | Nowka | G01R 31/318555 714/724 |
| 2016/0232129 A1 | * | 8/2016 | Tianxiang | G06F 8/31 |

* cited by examiner

*Primary Examiner* — M. Mujtaba Chaudry
(74) *Attorney, Agent, or Firm* — Tarolli, Sundheim, Covell & Tummino

(57) ABSTRACT

One example embodiment includes a circuit system. The system includes a wave-pipelined combinational logic circuit comprising at least one logic gate between an input node and at least one output node and configured to perform logic operations on a data sequence received at the input node. The system also includes a scan path connected to the input node and comprising at least one delay element configured to propagate the data sequence from the input to a scan path output to capture values of the data sequence provided to the wave-pipelined combinational logic circuit as a serial data stream. The system also includes a scan point device configured to deliver one of input data and scan data as the data sequence to the wave-pipelined combinational logic circuit and to the scan path via the input node in a respective one of a normal operating mode and a scan mode.

20 Claims, 5 Drawing Sheets

US 9,864,005 B1

WAVE-PIPELINED LOGIC CIRCUIT SCANNING SYSTEM

TECHNICAL FIELD

This disclosure relates generally to circuit systems, and specifically to a wave-pipelined logic circuit scanning system.

BACKGROUND

Wave-pipelining is a form of logic design in which multiple bits can propagate along a single logical path without intervening flip-flops or latches. Because such a circuit does not include flip-flops or latches, it can be difficult to implement controllability and observability with respect to wave-pipelines. Traditional scan flip-flops or latches can observe their inputs and control their outputs when a pipeline only advances between these elements one clock at a time, but these devices can neither control nor observe a wave-pipeline adequately because wave-pipeline semantics are sequential rather than combinational. Diagnostic schemes that allow the entire state of the system to be saved and then later restored to resume execution are generally desirable, as they can allow all logic faults to be diagnosed, given enough points of controllability and observability.

SUMMARY

An example system is provided that includes a circuit system. The system includes a wave-pipelined combinational logic circuit comprising at least one logic gate between an input node and at least one output node and configured to perform logic operations on a data sequence received at the input node. The system also includes a scan path connected to the input node and comprising at least one delay element configured to propagate the data sequence from the input to a scan path output to capture values of the data sequence provided to the wave-pipelined combinational logic circuit as a serial data stream. The system also includes a scan point device configured to deliver one of input data and scan data as the data sequence to the wave-pipelined combinational logic circuit and to the scan path via the input node in a respective one of a normal operating mode and a scan mode.

Another example is provided that is a method for monitoring data in a circuit system. The method includes providing each of a plurality of data sequences to a respective one of a plurality of scan paths and a respective plurality of inputs of a wave-pipelined combinational logic circuit via a respective plurality of scan point devices, the wave-pipelined combinational logic circuit comprising at least one logic gate between an input node and at least one output node and configured to perform logic operations on a data sequence received at the input node. The method also includes performing logic operations on each of the plurality of data sequences via the wave-pipelined combinational logic circuit. The method also includes switching each of the plurality of scan point devices from a normal operating mode to a scan mode in response to a mode signal. The method also includes propagating a serial data stream corresponding to the plurality of data sequences through each of the plurality of scan paths via each of the respective plurality of scan point devices and from a system scan output of the circuit system. The method further includes analyzing values of the plurality of data sequences at a given clock-cycle of a clock signal based on the serial data stream via a logic monitoring system connected to the scan output.

Yet another example is provided that is a Reciprocal Quantum Logic (RQL) circuit system. The system includes a wave-pipelined combinational logic circuit comprising at least one RQL logic gate between one of a plurality of input nodes and at least one output and configured to perform logic operations on a data sequence of Single Flux Quantum (SFQ) pulses received at the input node. The system also includes a plurality of scan paths that are each connected to a respective one of the plurality of input nodes associated with the wave-pipelined combinational logic circuit and each comprising a plurality of Josephson Transmission Lines (JTLs) configured to propagate the data sequence based on an AC clock signal. The system further includes a plurality of scan point devices configured to provide one of input data and scan data as the data sequence to the respective wave-pipelined combinational logic circuit and to the respective plurality of scan paths in a respective one of a normal operating mode and a scan mode, such that the plurality of scan paths are coupled in series via the respective plurality of scan point devices in the scan mode to form a scan chain between a system scan input and a system scan output associated with the circuit system, the scan chain being configured to propagate a serial data stream through the circuit system corresponding to the data sequence provided to each of the plurality of inputs of the wave-pipelined combinational logic circuit to capture the values of the data sequence provided to the wave-pipelined combinational logic circuit.

DETAILED DESCRIPTION

Figure 1:
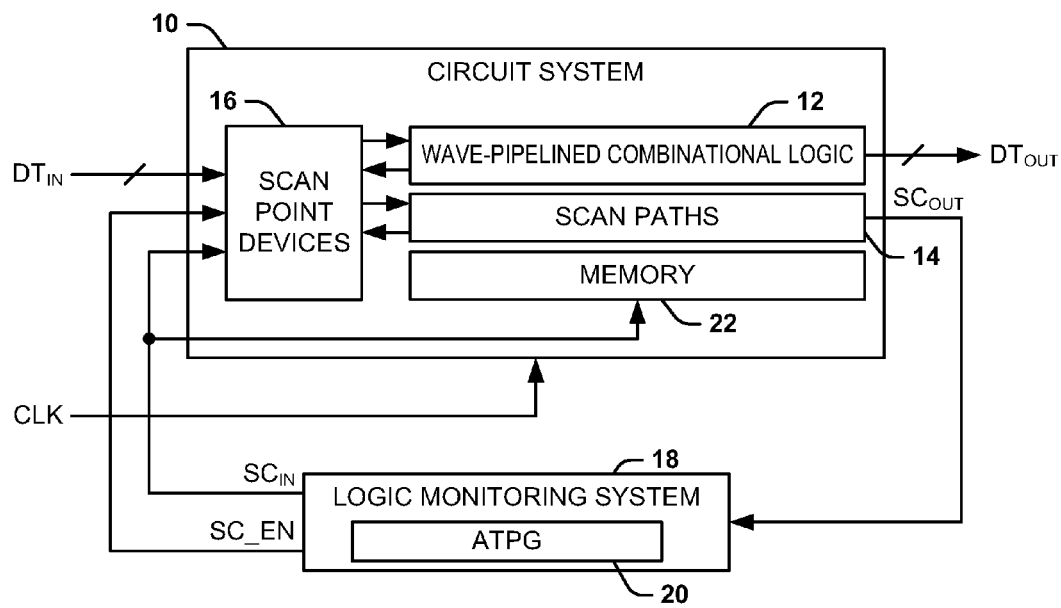
FIG. 1 illustrates an example of a circuit system.

This disclosure relates generally to circuit systems, and specifically to a wave-pipelined logic circuit scanning system. The wave-pipelined logic circuit scanning system can be implemented in a circuit system that includes a wave-pipelined combinational logic circuit that include at least one logic gate between an input node and an output node that performs logic operations on a data stream in a wave-pipeline. Thus, the wave-pipelined combinational logic circuit includes one or more wave-pipelines of circuit components. The circuit system also includes a plurality of scan paths that each has an input that is connected to a respective input associated with the wave-pipelined combinational logic circuit. The scan paths each include a sequence of series-connected delay elements that propagate the data stream (e.g., based on a clock signal), such that the scan paths capture the values of the data stream provided to the wave-pipelined combinational logic circuit at a given clock-cycle. The circuit system also includes a plurality of scan point devices that each provide the respective data stream to the wave-pipelined combinational logic circuit (e.g., at the respective inputs) and a respective one of the scan paths. The scan point devices can provide one of input data (e.g., provided from the wave-pipelined combinational logic circuit) or scan data (e.g., provided from a scan path) as the data stream in a respective one of a normal operating mode and a scan mode. Therefore, in the scan mode, the scan point devices restore the values of the data streams to the wave-pipelined combinational logic circuit at full speed of the circuit.

The scan paths are arranged in series in the scan mode to form a scan chain corresponding to a single aggregate scan path that propagates a serial data stream corresponding to the data streams provided to the wave-pipelined combinational logic circuit. Therefore, in the scan mode, the entire serial data stream is provided from the circuit system (e.g., via a system scan output) and is analyzed by a logic monitoring system, such as to analyze the logic operations of the wave-pipelined combinational logic circuit. For example, the serial data stream is read out, such that the values of the data stream at a given clock-cycle are analyzed. As an example, individual test vectors can be provided across data streams, such as at the same time point in a logical wave-pipeline, such that algorithms (e.g., path sensitization algorithms) can be implemented to test performance of individual wave-pipelined combinational logic circuits (e.g., to determine stuck-at faults or a variety of other fault conditions). The serial data stream can be read back into the circuit system in the scan mode to restore the values of the data streams to the wave-pipelined combinational logic circuit to the values at the given clock-cycle, and the circuit system is switched from the scan mode to the normal operating mode for at least one clock-cycle before being switched back to the scan mode to scan the serial data stream out of the circuit system again. Therefore, the serial data stream is analyzed to determine the results of the logic operations that occurred during the clock-cycle.

The circuit system that includes the pipeline scanning system can be implemented in a variety of different types of circuits. As one example, the circuit system is implemented as a Reciprocal Quantum Logic (RQL) circuit system. In an RQL circuit system, the pipelined combinational logic circuit includes RQL gate systems that perform logic operations based on the data stream being provided as a sequence of and absence of Single Flux Quantum (SFQ) pulses. The delay elements in the scan paths of the RQL circuit system can be arranged as Josephson Transmission Lines (JTLs) that propagate the data stream of SFQ pulses based on an AC clock signal (e.g., a quadrature clock signal). Therefore, operation of the RQL circuit system is tested based on the pipeline scanning system.

FIG. 1 illustrates an example of a circuit system 10. The circuit system 10 can be any of a variety of different types of classic computing or quantum computing circuits. As an example, the circuit system 10 is implemented as or as part of an integrated circuit (IC) chip, and as another example, the circuit system 10 is configured as a Reciprocal Quantum Logic (RQL) circuit. The circuit system 10 includes a wave-pipelined combinational logic circuit 12 that performs logic operations on data streams that are provided via respective inputs. As described herein, the term "wave-pipelined combinational logic circuit" describes an example of a wave-pipeline combinational logic circuit that includes one or more logic gates in a combinational wave-pipeline arrangement between an input and an output of the wave-pipelined combinational logic circuit 12. The wave-pipelined combinational logic circuit 12 is arranged between one or more system data inputs of the circuit system 10 and one or more system data outputs of the circuit system 10 to provide data processing capability, and thus provide system output data $DT_{OUT}$ at the one or more data outputs in response to system input data $DT_{IN}$ provided at the one or more data inputs.

The circuit system 10 also includes a plurality of scan paths 14 that each propagates a data stream that is provided to a respective input of the wave-pipelined combinational logic circuit 12, and thus stores the values that are provided on the respective data streams that are processed by the wave-pipelined combinational logic circuit 12. As an example, each of the scan paths 14 includes at least one delay element that propagate the data stream in a sequential manner. The delay elements in each of the scan paths 14 are clocked or unclocked delay elements having a known delay (e.g., corresponding to one or more clock-cycles of a clock signal CLK). The circuit system 10 further includes a plurality of scan point devices 16 that are each connected to respective inputs and outputs of the wave-pipelined combinational logic circuit 12 and the scan paths 14. Each of the scan point devices 16 provides a data stream to a respective input of the wave-pipelined combinational logic circuit 12 and to a respective one of the scan paths 14. The scan point devices 16, for example, include multiplexers that each select between providing input data, such as corresponding to the system input data $DT_{IN}$ or data provided from an output of the wave-pipelined combinational logic circuit 12 (e.g., including the system outputs that provide the system output data $DT_{OUT}$), as the data stream in a normal operating mode of the circuit system 10. In the example of the circuit system 10 being an RQL circuit system, the scan paths 14 include delay elements that are configured as Josephson Transmission Lines (JTLs) that are controlled via the clock signal CLK (e.g., an AC clock signal).

The scan paths 14 each have a length (defined by delay elements) that is at least as long as the delay from an output of its source scan point device 16 to the farthest scan point device 16 data input reachable via the logic also connected to its source scan point device 16 output. Therefore, the number of delay elements of each of the scan paths 14 corresponds to at least a longest path length in clock-cycles associated with the wave-pipelined combinational logic circuit 12. Additionally, the scan point devices 16 provide scan data, such as corresponding to one of system scan input data $SC_{IN}$ and scan data provided from one of the scan paths 14, as the data stream during a scan mode of the circuit system 10. As an example, the circuit system 10 is toggled between the normal operating mode and the scan mode via a mode signal SC_EN that enables the scan mode for all of the scan point devices 16 simultaneously.

Thus, in the scan mode, all of the scan paths 14 are arranged in series with each other via the scan point devices 16 to form a scan chain corresponding to an aggregate scan path that propagates the data streams associated with the wave-pipelined combinational logic circuit 12 to provide system scan output data $SC_{OUT}$ as a single serial data stream from the circuit system 10 at full speed operation of the circuit system 10 via the clock signal CLK. The system scan output data $SC_{OUT}$ is thus captured at a given time, such as at a given clock-cycle of the clock signal CLK, to capture the values of the data streams that are provided to each of the wave-pipelined combinational logic circuit 12. Accordingly, the captured values of the data streams, as provided in the serial data stream corresponding to the system scan output data $SC_{OUT}$, can be analyzed, such as to test performance of the circuit system 10 (e.g., via the logic operations of the wave-pipelined combinational logic circuit 12). As an example, individual test vectors can be provided across data streams, such as at the same time point in a logical wave-pipeline, such that algorithms (e.g., path sensitization algorithms) are implemented to test performance of the individual wave-pipelined combinational logic circuit 12, such as to determine stuck-at faults or a variety of other fault conditions.

In the example of FIG. 1, the system scan output data $SC_{OUT}$ is provided as the single serial data stream to a logic monitoring system 18. It is to be understood that the logic monitoring system 18 is implemented as a combination of hardware and software to provide the functionality described herein. As an example, the logic monitoring system 18 identifies the data streams associated with each of the scan paths 14 in the system scan output data $SC_{OUT}$ based on a predetermined mapping system that associates a given one of the data streams with a scan point device 16 as a function of position and length in the single serial data stream in the scan chain, and thus a respective input of the wave-pipelined combinational logic circuit 12) and to analyze the data stream to determine correct operation of the wave-pipelined combinational logic circuit 12. In the example of FIG. 1, the logic monitoring system 18 provides the mode signal SC_EN, such that the logic monitoring system 18 sets the circuit system 10 in either the normal operating mode or the scan mode.

In the example of FIG. 1, the logic monitoring system 18 sets the circuit system 10 to the scan mode to provide the system scan output data $SC_{OUT}$ as the single serial data stream via each of the scan point devices 16 to capture the system scan output data $SC_{OUT}$ at a given clock-cycle of the clock signal CLK, and thus to capture the values of the data streams that are provided to each of the wave-pipelined combinational logic circuit 12. Accordingly, the captured values of the data streams, as provided in the serial data stream corresponding to the system scan output data $SC_{OUT}$, are analyzed by the logic monitoring system 18 to test performance of the circuit system 10 (e.g., via the logic operations of the wave-pipelined combinational logic circuit 12). Test vectors corresponding to the data streams are identified within the single serial data stream, such that algorithms (e.g., path sensitization algorithms as described in greater detail in the example of FIG. 4) are implemented to test performance of the individual wave-pipelined combinational logic circuit 12, such as to determine stuck-at faults or a variety of other fault conditions. For example, upon receiving the single serial data stream associated with the system scan output data $SC_{OUT}$, the logic monitoring system 18 provides the single serial data stream back to the circuit system 10 as system scan input data $SC_{IN}$ to restore the values of the data streams corresponding to the data sequences provided through the wave-pipelined combinational logic circuit 12 at the given clock-cycle at which the data streams were captured.

Upon a predetermined number of clock-cycles of the clock signal CLK, the logic monitoring system 18 identifies that the state of the circuit system 10 has been completely restored based on the values of each of the data streams being provided back through each of the respective wave-pipelined combinational logic circuit 12. Thus, the logic monitoring system 18 switches the circuit system 10 back to the normal operating mode for a predetermined number of clock-cycles of the clock signal CLK before again switching the circuit system 10 back to the scan mode. Upon switching the circuit system 10 back to the scan mode, the single serial data stream associated with the system scan output data $SC_{OUT}$ is provided via each of the scan point devices 16 back to the logic monitoring system 18 to again capture the system scan output data $SC_{OUT}$ at another given clock-cycle of the clock signal CLK (e.g., a next clock-cycle) to capture the values of the data streams that are provided to the wave-pipelined combinational logic circuit 12. Accordingly, the two sets of captured values of the data streams are analyzed by the logic monitoring system 18 as a "before" and "after" snapshot of the data to test performance of the circuit system 10 (e.g., via the logic operations of the wave-pipelined combinational logic circuit 12). In other words, the logic monitoring system 18 analyzes the difference between the two sets of data streams to determine the logic operation of the wave-pipelined combinational logic circuit 12 in the number of clock-cycles difference to test the performance of the wave-pipelined combinational logic circuit 12.

In addition, in the example of FIG. 1, the logic monitoring system 18 includes an automatic test pattern generator (ATPG) 20 that generates predetermined serial test streams that are provided to the system scan input as the scan input data $SC_{IN}$. The predetermined serial test stream is thus derived from predetermined test vectors for testing the operation of the wave-pipelined combinational logic circuit 12 during the scan mode. In the example of FIG. 1, the logic monitoring system 18 receives a signal TV that corresponds to an input associated with data that defines the test vectors (e.g., as generated via external software, such as in Verilog or VHDL). Additionally, in the example of FIG. 1, the circuit system 10 also includes memory 22 that stores data in the normal operating mode, to be retrieved during operation of the circuit system 10 in the normal operating mode. For example, in response to the circuit system 10 being switched to the scan mode and/or during testing of the circuit system 10, the memory 22 is disabled, such that the states of the data stored therein are preserved during the scan mode. As a result, the memory 22 maintains the state of the data stored therein during the scan mode, while the logic monitoring system 18 can store the responses to the logic testing provided during the scan mode. The ATPG 20 can thus arrange the sequence that is provided to the circuit system 10 as the scan input data $SC_{IN}$ such as based on analysis of the scan output data $SC_{OUT}$ via the logic monitoring system 18 during the scan mode.

In addition, the test vectors and associated responses with respect to the logic monitoring system 18 can provide additional information to test operation of the wave-pipelined combination logic 12. For example, the test vectors and responses can determine a duration of a SCAN_IN operation corresponding to a number of clock cycles that is required to provide the test vectors of the input single serial data stream $SC_{IN}$ to the respective logic of the wave-pipelined combination logic 12 to be tested. As another example, the test vectors and responses can determine a clock duration of a SCAN_OUT operation corresponding to a number of clock cycles that is required to completely output the system scan output data $SC_{OUT}$ from the scan paths 14. As yet another example, the test vectors and responses can determine a clock duration of a RUN operation corresponding to a number of clock cycles of the logic operations of the logic gates of the wave-pipelined combination logic 12 operating in the normal operating mode on the sequentially-provided test vectors (e.g., in any or all variations of inputs), and/or a number of clock cycles of the test vectors being provided through each of the scan point devices 16 as the system scan output data $SC_{OUT}$. Accordingly, the logic monitoring system 18 can provide a variety of information based on analyzing the input single serial data stream $SC_{EN}$ and the scan output data $SC_{OUT}$.

Figure 2:
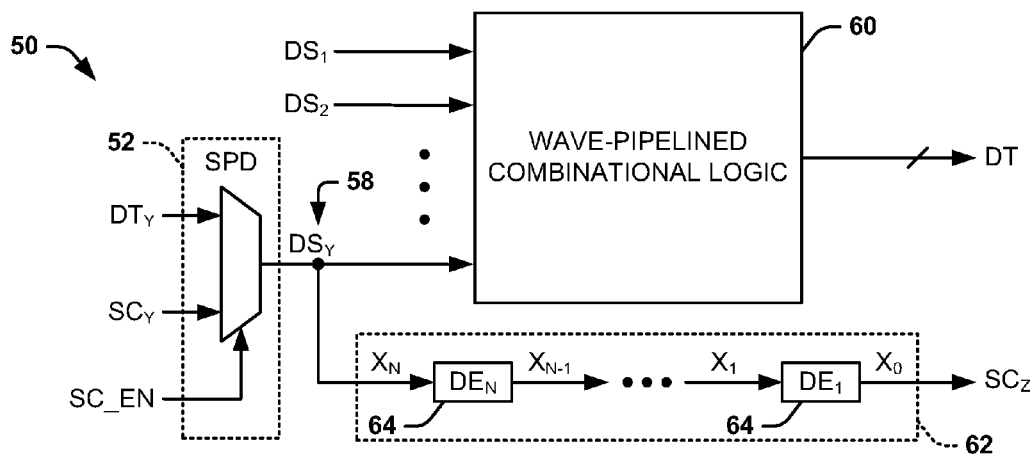
FIG. 2 illustrates an example of wave-pipeline scanning system.

FIG. 2 illustrates an example of wave-pipeline scanning system 50. The wave-pipeline scanning system 50 can be associated with the circuit system 10 in the example of FIG. 1. Therefore, reference is to be made to the example of FIG. 1 in the following description of the example of FIG. 2.

The wave-pipeline scanning system 50 includes a plurality Y of scan point devices 52, with each of the scan point devices 52 being configured substantially identically and being configured to receive data streams $DT_1$ through $DT_Y$, respectively, and scan data $SC_1$ through $SC_Y$, respectively. In the example of FIG. 2, the $Y^{th}$ scan point device 52, is demonstrated as a multiplexer to select between data stream $DT_Y$ and scan data $SC_Y$ associated with the wave-pipeline scanning system 50 based on the mode signal SC_EN that provides the selected one of the data stream $DT_Y$ and the scan data $SC_Y$ to a node 58. In the example of FIG. 2, the mode signal SC_EN is associated with each of the scan point devices 16 in the circuit system 10 to switch all of the scan point devices 16, and thus the circuit system 10, between the scan mode and the normal operating mode. Each of the scan point devices 52 provides the one of the respective data stream DT and scan data SC as a respective data stream DS to an output node. Thus, in the example of FIG. 2, the $Y^{th}$ scan point device 52 provides the one of the data stream $DT_Y$ and scan data $SC_Y$ as a data stream $DS_Y$ to the node 58 corresponding to an output of the $Y^{th}$ scan point device 52.

The output node of each of the scan point devices 52 also corresponds to a respective input of a wave-pipelined combinational logic circuit 60 and an input of one of a respective plurality Y of scan paths 62. Thus, in the example of FIG. 2, the node 58 also corresponds to an input of a wave-pipelined combinational logic circuit 60 and a $Y^{th}$ scan path 62, such that the data stream $DS_Y$ is thus provided to the wave-pipelined combinational logic circuit 60 and the $Y^{th}$ scan path 62. In the example of FIG. 2, the wave-pipelined combinational logic circuit 60 includes a plurality Y of inputs that each receive a respective one of the data streams $DS_1$ through $DS_Y$. Thus, the data stream $DS_Y$ is provided to the $Y^{th}$ input in the example of FIG. 2. For example, the wave-pipelined combinational logic circuit 60 includes a wave-pipeline arrangement of logic devices (e.g., wave-pipelined logic gates) that performs logic operations on the data streams $DS_1$ through $DS_Y$. Thus, the wave-pipelined combinational logic circuit 60 performs logic operations on the data streams $DS_1$ through $DS_Y$ to provide output data streams DT that is provided at one or more respective outputs. As an example, the output data streams DT correspond to respective input data that are provided to other wave-pipeline scanning system(s), such that one or more additional scan point devices select between the respective output data streams DT and other scan data in response to the mode signal SC_EN.

In the example of FIG. 2, the $Y^{th}$ scan path 62 includes a plurality N of delay elements 64. The delay elements 64 can be configured as any of a variety of circuit devices that propagate each bit of the data stream $DS_Y$ sequentially. In the example of FIG. 2, the first bit in the time sequence of propagation of the data stream $DS_Y$ is represented by a bit $X_0$, with each delay element 60 providing a next bit in the sequence to bit $X_N$ that is representative of a current bit of the data stream $DS_Y$ at the node 58. As an example, the delay elements 64 sequentially clock the data stream $DS_Y$ as a time-wise sequence of the bits $X_0$ through $X_N$ of the data stream $DS_Y$ that is "in flight", as modified by the wave-pipelined combinational logic circuit 60. Thus, the $Y^{th}$ scan path 62 propagates the data stream $DS_Y$ to provide scan data $SC_Z$. As an example, the scan data $SC_Z$ corresponds to scan data that is provided to another wave-pipeline scanning system, such that another scan point device selects between the input data (e.g., the data $DT_Z$) and the scan data $SC_Z$ in response to the mode signal SC_EN.

Figure 3:
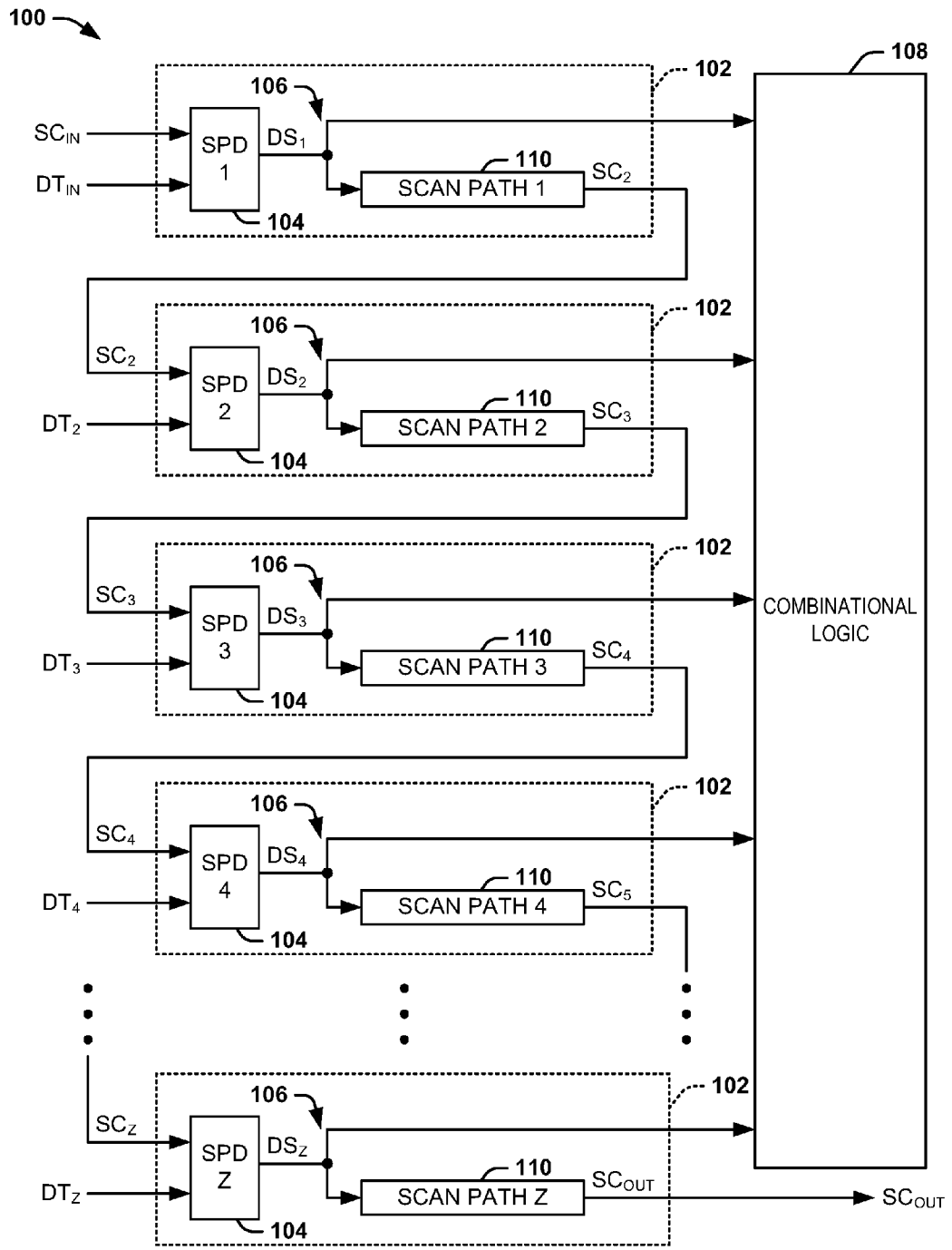
FIG. 3 illustrates another example of a circuit system.

FIG. 3 illustrates another example of a circuit system 100. The circuit system 100 includes a plurality Z of wave-pipeline scanning systems 102 that can each be configured substantially similar to the wave-pipeline scanning system 50 in the example of FIG. 2. As an example, the circuit system 100 corresponds to the circuit system 10 in the example of FIG. 1. Therefore, reference is to be made to the examples of FIGS. 1 and 2 in the following description of the example of FIG. 3.

Each of the wave-pipeline scanning systems 102 includes a scan point device (SPD) 104 that selects between input data and scan data based on the mode signal (e.g., the mode signal SC_EN). As described previously, the mode signal SC_EN is associated with all of the scan point devices 104 in the circuit system 100 to switch all of the scan point devices 104, and thus the entire circuit system 100, between the scan mode and the normal operating mode. The scan point devices 104 thus provide the selected one of the input data and the scan data as a data stream DS, demonstrated as data streams $DS_1$ through $DS_Z$, at a respective node 106 corresponding to an output of the respective scan point device 104. In the example of FIG. 3, the circuit system 100 includes a wave-pipelined combinational logic circuit 108 that receives the data streams $DS_1$ through $DS_Z$ at respective inputs via the nodes 106, and provides one or more outputs, such as similar to the output data stream(s) DT in the example of FIG. 2.

In addition, each of the wave-pipeline scanning systems 102 includes a scan path 110 connected to the respective node 106, with the scan point devices 104 and the scan paths 110 being numbered from 1 to Z. While the example of FIG. 3 demonstrates a sequence of wave-pipeline scanning systems 102, it is to be understood that the scan point devices 104 can be distributed across the circuit system 100 in any of a variety of additional arrangements, as well, to provide a single serial scan chain. For example, scan point devices 104 are provided at each input and each output of memory devices (e.g., caches, register files, and/or any of a variety of other types of memory), to control the inputs and observe the outputs of the circuit system 100. Additionally, the wave-pipelined combinational logic circuit 108 has a scan point device 104 associated with each input and with each output, with each scan point device 104 also providing the data stream to a respective scan path 110.

In the example of FIG. 3, the first of the pipeline scanning systems 102 that includes SCAN PATH 1 receives system input data $DT_{IN}$ and system scan input data $SC_{IN}$ that correspond to inputs provided to the IC chip that includes the circuit system 100. For example, the system input data $DT_{IN}$ may be provided from a separate device external to the circuit, and the system scan input data $SC_{IN}$ is provided from the logic monitoring device 18 that is implemented to test the circuit, such as with respect to the logic operations of the pipelined combinational logic circuit 108. The scan path 110 of the first pipeline scanning system 102 provides scan data $SC_2$ that is provided to the scan point device 104 of the second of the pipeline scanning systems 102 that includes SCAN PATH 2.

In the example of FIG. 3, the second of the wave-pipeline scanning systems 102 that includes SCAN PATH 2 receives input data $DT_2$ and the scan data $SC_2$. As an example, the input data $DT_2$ corresponds to input data from an output of the wave-pipelined combinational logic circuit 108. The scan path 110 of the second wave-pipeline scanning system 102 provides scan data $SC_3$ that is provided to the scan point device 104 of the third of the wave-pipeline scanning systems 102 that includes SCAN PATH 3. Accordingly, the wave-pipeline scanning systems 102 are similarly arranged, including a last of the wave-pipeline scanning systems 102 that includes SCAN PATH Z and which receives input data $DT_Z$ and the scan data $SC_Z$. As an example, the input data $DT_Z$ corresponds to input data provided from an output of the wave-pipelined combinational logic circuit 108. The scan path 110 of the last wave-pipeline scanning system 102 provides circuit output scan data $SC_{OUT}$ as a single serial data stream from the circuit system 100, for example, to the logic monitoring system 18.

Therefore, in the example of FIG. 3, the wave-pipeline scanning systems 102 are each associated with a respective one input or output of the wave-pipelined combinational logic circuit 108. In the example of FIG. 3, the scan paths 110 are demonstrated as sequential with respect to the wave-pipeline scanning systems 102 (e.g., in the demonstrated sequence from 1 to Z). The number of delay elements in each of the scan paths 110 is equal to or greater than the number of clock-cycles associated with the greatest defined path length between its own input and any output of the wave-pipelined combinational logic circuit 108, which result can depend on that input.

Therefore, when the scan point devices 104 are set to the scan mode (e.g., via the mode signal SC_EN), the scan paths 110 of each of the wave-pipeline scanning systems 102 are arranged in series with respect to each other via the scan point devices 104 to form a scan chain. Thus, the scan paths 110 propagate the respective data streams DS associated with each of the wave-pipelined combinational logic circuit 108 to provide the system scan output data $SC_{OUT}$ as the single serial data stream from the circuit system 100 to the logic monitoring system 18. The system scan output data $SC_{OUT}$ are thus captured at a given time, such as at a given clock-cycle of the clock signal CLK, to capture the values of the data streams that are provided to each of the wave-pipelined combinational logic circuit 108. The arrangement of each of the scan paths 110 is a priori known with respect to the corresponding wave-pipelined combinational logic circuit 108, to allow identification of the specific data streams DS in the captured single serial data stream corresponding to the system scan output data $SC_{OUT}$. Accordingly, the captured values of the data streams DS, as provided in the serial data stream corresponding to the system scan output data $SC_{OUT}$, are analyzed to test performance of the circuit system 100 (e.g., via the logic operations of the wave-pipelined combinational logic circuit 108).

Figure 4:
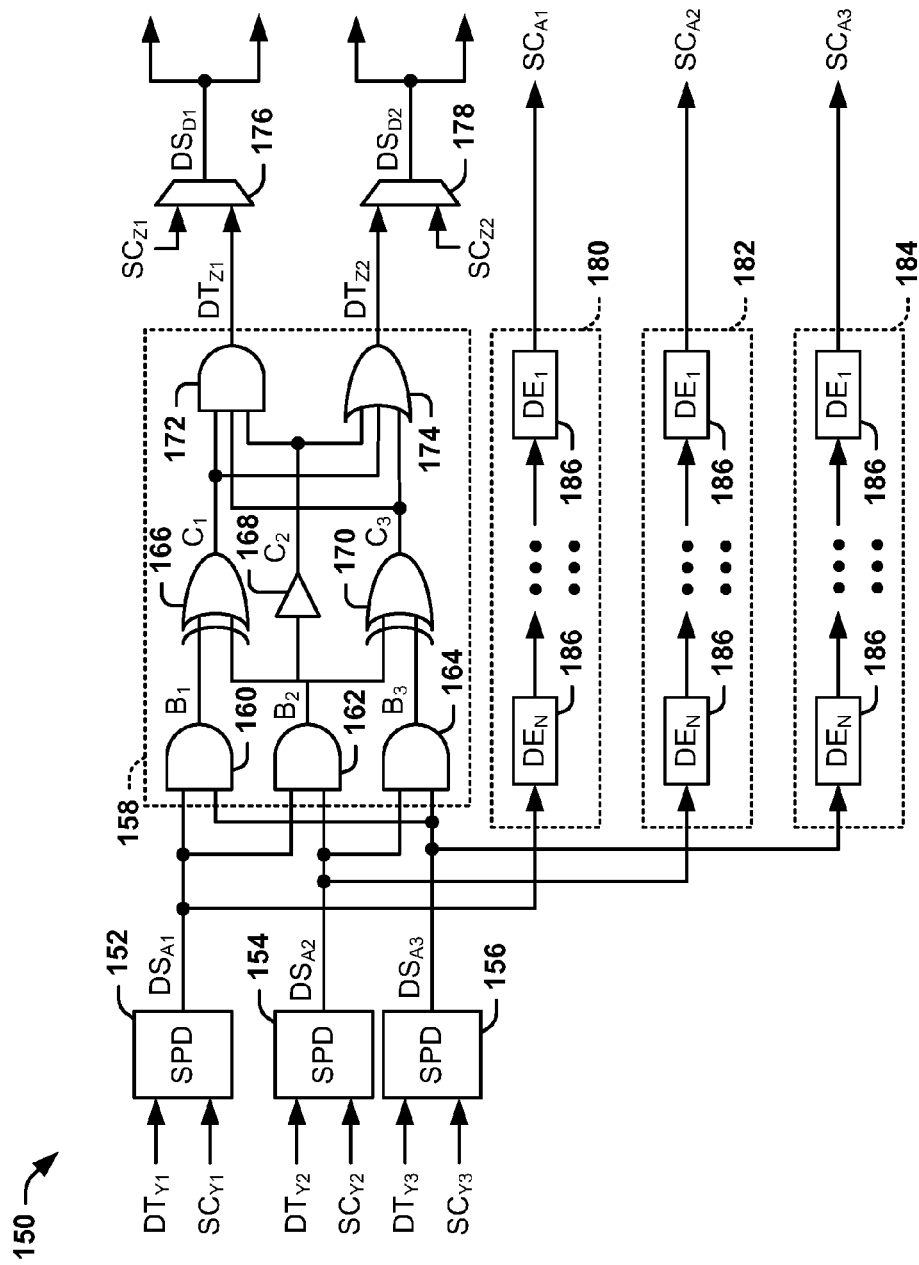
FIG. 4 illustrates yet another example of a circuit system.

FIG. 4 illustrates yet another example of a circuit system 150. As an example, the circuit system 150 can correspond to the wave-pipeline scanning circuit 50 in the example of FIG. 2. The circuit system 150 includes a first scan point device 152, a second scan point device 154, and a third scan point device 156. The first scan point device 152 selects between input data $DT_{Y1}$ and scan data $SC_{Y1}$ to provide a first data stream $DS_{A1}$, the second scan point device 154 selects between input data $DT_{Y2}$ and scan data $SC_{Y2}$ to provide a second data stream $DS_{A2}$, and the third scan point device 156 selects between input data $DT_{Y3}$ and scan data $SC_{Y3}$ to provide a third data stream $DS_{A3}$ (e.g., via the mode signal SC_EN). The data streams $DS_{A1}$, $DS_{A2}$, and $DS_{A3}$ are provided to a wave-pipelined combinational logic circuit 158. The wave-pipelined combinational logic circuit 158 includes a first AND-gate 160 that receives the first and third data streams $DS_{A1}$ and $DS_{A3}$ to provide data $B_1$, a second AND-gate 162 that receives the first and second data streams $DS_{A1}$ and $DS_{A2}$ to provide data $B_2$, and a third AND-gate 164 that receives the second and third data streams $DS_{A2}$ and $DS_{A3}$ to provide data $B_3$. The wave-pipelined combinational logic circuit 158 also includes a first XOR-gate 166 that receives the data $B_1$ and the data $B_2$ to provide data $C_1$, a buffer 168 that receives the data $B_2$ to provide data $C_2$, and a second XOR-gate 170 that receives the data $B_2$ and the data $B_3$ to provide data $C_3$. The wave-pipelined combinational logic circuit 158 further includes an output AND-gate 172 that receives the data $C_1$, $C_2$, and $C_3$ to provide output data $DT_{Z1}$ and an output OR-gate 174 that receives the data $C_1$, $C_2$, and $C_3$ to provide output data $DT_{Z2}$. The output data $DT_{Z1}$ and $DT_{Z2}$ are provided, respectively, to scan point devices 176 and 178. The scan point device 176 provides a data stream $DS_{D1}$ based on the data $DT_{Z1}$ or scan data $SC_{Z1}$ and the scan point device 178 provides a data stream $DS_{D2}$ based on the data $DT_{Z2}$ or scan data $SC_{Z2}$.

In addition, the circuit system 150 includes a first scan path 180 that receives the data stream $DS_{A1}$ from the first scan point device 152, a second scan path 182 that receives the data stream $DS_{A2}$ from the second scan point device 154, and a third scan path 184 that receives the data stream $DS_{A3}$ from the third scan point device 156. Each of the scan paths 180, 182, and 184 includes a plurality N of delay elements 186. For example, the number N of delay elements corresponds to a quantity of clock-cycles associated with a greatest defined path length of the wave-pipelined combinational logic circuit in the associated circuit. As an alternative example, if it took thirty clock cycles for a bit to propagate from $DS_{A1}$ to the further of $DT_{Z1}$ and $DT_{Z2}$ but only three cycles from the other inputs $DS_{A2}$ and $DS_{A3}$, the number N in 180 would have to be at least thirty. The delay elements 186 can be configured as any of a variety of circuit devices that propagate each bit of the respective data streams $DS_{A1}$, $DS_{A2}$, and $DS_{A3}$ sequentially. As an example, the delay elements 186 of the scan paths 180, 182, and 184 are data latches that sequentially clock and propagate the respective data streams $DS_{A1}$, $DS_{A2}$, and $DS_{A3}$ as a sequence of bits that is provided from the scan path 180 as scan data $SC_{A1}$ corresponding to the data stream $DS_{A1}$, from the scan path 182 as scan data $SC_{A2}$ corresponding to the data stream $DS_{A2}$, and from the scan path 184 as scan data $SC_{A3}$ corresponding to the data stream $DS_{A3}$. As an example, the sets of scan data $SC_{A1}$, $SC_{A2}$, and $SC_{A3}$ are provided to other respective wave-pipeline scanning system (s).

As an example, the scan point devices 152, 154, and 156 are set to the scan mode (e.g., via the mode signal SC_EN) to test the logic operation performance of the wave-pipelined combinational logic circuit 158. As an example, each of the logic elements in the wave-pipelined combinational logic circuit 158, including the AND-gates 160, 162, and 164; the XOR-gates 166 and 170; the buffer 168; the output AND-gate 172; and the output OR-gate 174, has a delay of one clock-cycle. For example, a first bit of the data stream $DS_{A1}$ is set to a logic-1, a first bit of the data stream $DS_{A3}$ is set to a logic-0, and the first bit of the data stream $DS_{A2}$ is X, where X is a variable (either logic-0 or logic-1). As an example, an associated logic monitoring system that receives the single serial data stream that includes the scan data $SC_{A1}$, $SC_{A2}$, and $SC_{A3}$ implements a path sensitization algorithm to test the logic operation of the wave-pipelined combinational logic circuit 158. As an example, the path sensitization algorithm is implemented to control the wave-pipelined combinational logic circuit to make the variable X (or its complement) appear at every node along a path of the wave-pipelined combinational logic circuit 158. If the variable X (or its complement) is observed at the end of the path, then the logic monitoring system determines that the entire path contains no stuck-at faults.

For example, three test vectors 1X0, 0X1, and X01 whose bits correspond to bits of each of the respective data streams $DS_{A1}$, $DS_{A2}$, and $DS_{A3}$ leads to the five test vectors 100, 110, 001, 011, 101 that can fully diagnose the pipelined combinational logic circuit 158. In the example of FIG. 4, assume the pipelined combinational logic circuit 158 has the same path length, namely 3, from each of the scan point devices 152, 154, and 156 to each of the scan point devices 176 and 178. Further assume the length of the scan chains attached to scan point devices 176 and 178 also have length three or more. Three test vectors are scanned in one after another in the scan mode and the circuit system 150 is then switched to run mode for three clock-cycles to record the results in the delay chains of the scan point devices 176 and 178. The circuit system 158 is then switched back to the scan mode to transfer the test results out of the circuit system 150.

Figure 5:
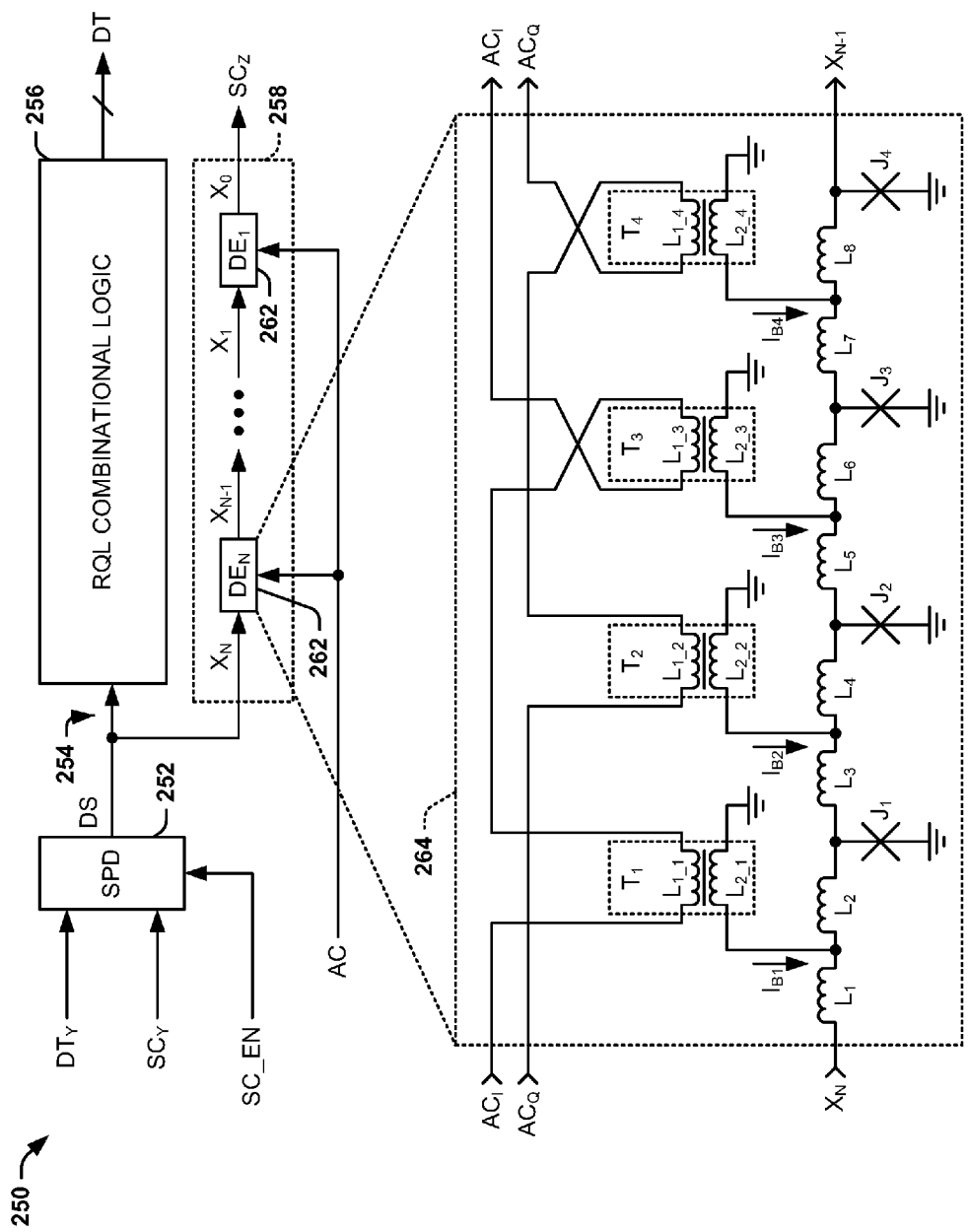
FIG. 5 illustrates yet another example of a wave-pipeline scanning system.
Figure 6:
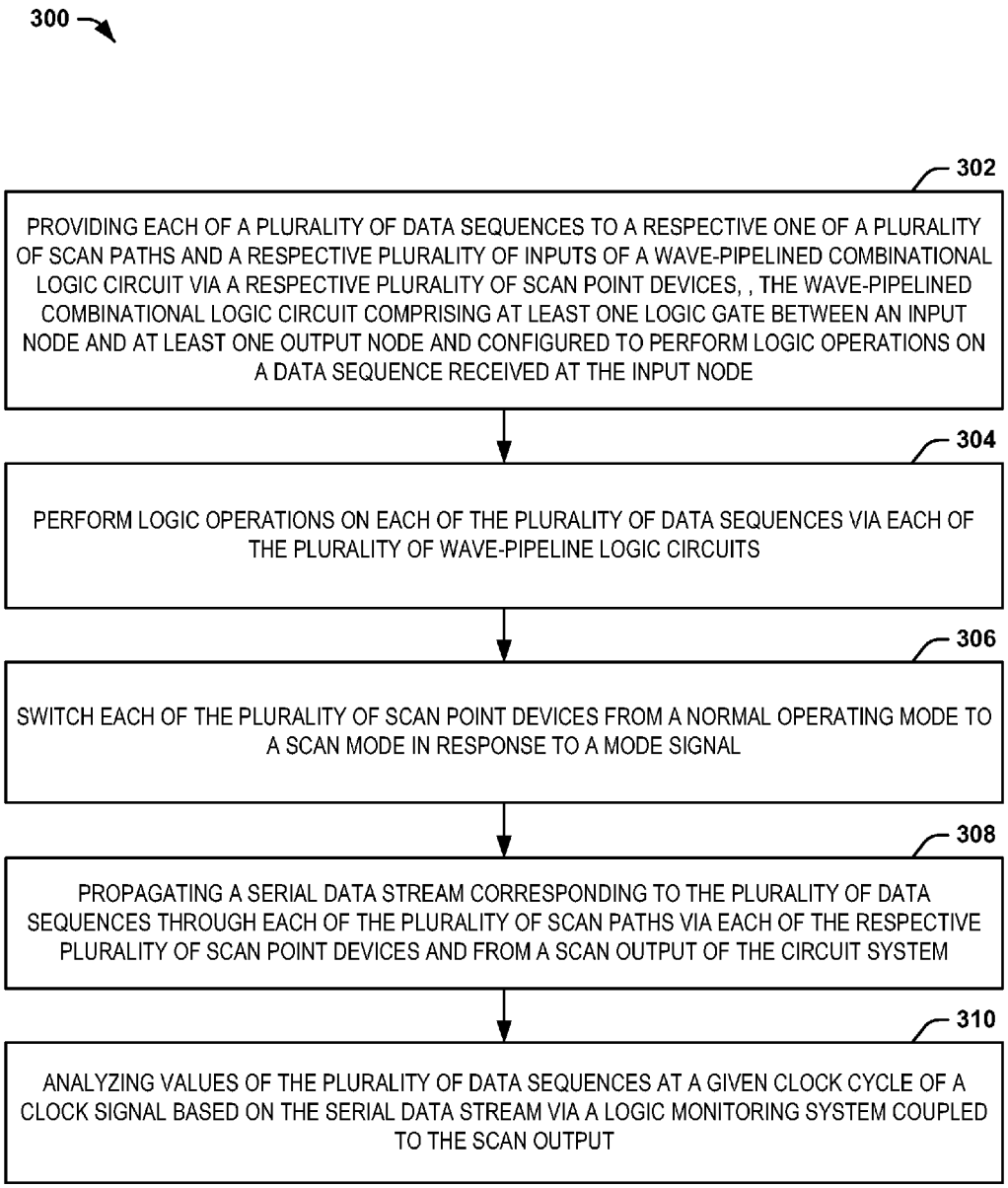
FIG. 6 illustrates an example of a method for monitoring data in a circuit system.

FIG. 5 illustrates another example of wave-pipeline scanning system 250. As an example, the circuit system 250 can correspond to the wave-pipeline scanning circuit 50 in the example of FIG. 2. In the example of FIG. 6, the wave-pipeline scanning system 250 is associated with an RQL circuit system.

The wave-pipeline scanning system 250 includes a scan point device 252 that selects between input data $DT_Y$ and scan data $SC_Y$ associated with the wave-pipeline scanning system 250 based on the mode signal SC_EN. As an example, the input data $DT_Y$ and the scan data $SC_Y$ is RQL data, and is thus provided as a sequence of SFQ pulses (e.g., the presence of an SFQ pulse at a given clock-cycle for a logic-1 and an absence of an SFQ pulse at a given clock-cycle for a logic-0). The scan point device 252 thus provides the one of the input data $DT_Y$ and scan data $SC_Y$ as a data stream DS at a node 254 corresponding to an output of the scan point device 252.

The node 254 also corresponds to one input of an RQL wave-pipelined combinational logic circuit 256 and an input of a scan path 258, such that the data stream DS is thus provided to each of the RQL wave-pipelined combinational logic circuit 256 and the scan path 258. In the example of FIG. 5, the RQL wave-pipelined combinational logic circuit 256 includes a wave-pipeline arrangement of at least one RQL logic gate that performs logic operations on the data stream DS in a combinational manner. Thus, the RQL wave-pipelined combinational logic circuit 256 performs logic operations on the data stream DS via the RQL logic gate(s) therein to provide output data DT at one or more respective outputs. As an example, the data stream(s) DT each correspond to input data that is provided to another wave-pipeline scanning system, such that another scan point device selects between the data stream DT and other scan data in response to the mode signal SC_EN.

In the example of FIG. 5, the scan path 258 includes a plurality N of delay elements 262, where N is a positive integer. In the example of FIG. 5, the delay elements 262 are demonstrated as JTLs that propagate each bit (e.g., SFQ pulse) of the data stream DS sequentially based on a quadrature clock signal AC. In the example of FIG. 5, the first bit in the time sequence of propagation of the data stream DS is represented by a bit $X_0$, with each delay element 60 providing a next bit in the sequence to bit $X_N$ that is representative of a current bit of the data stream DS at the node 254. In the example of FIG. 5, the $N^{th}$ delay element 262 is demonstrated as a JTL 264 in an exploded view. As an example, all of the delay elements 262 are configured substantially similar (e.g., substantially identical) to the JTL 264.

In the example of FIG. 5, the clock signal AC provided to the JTL 264 is demonstrated as including an in-phase clock signal $AC_I$ and a quadrature-phase clock signal $AC_Q$. The JTL 264 includes a first transformer $T_1$, a first inductor $L_1$, a second inductor $L_2$, and a first Josephson junction $J_1$. The JTL 264 also includes a second transformer $T_2$, a third inductor $L_3$, a fourth inductor $L_4$, and a second Josephson junction $J_1$. The JTL 264 also includes a third transformer $T_3$, a fifth inductor $L_5$, a sixth inductor $L_6$, and a third Josephson junction $J_3$. The JTL 264 further includes a fourth transformer $T_4$, a seventh inductor $L_7$, an eighth inductor $L_8$, and a fourth Josephson junction $J_4$. The transformers $T_1$ and $T_3$ include a primary winding $L_{1\_1}$ and $L_{1\_3}$, respectively, through which the in-phase clock signal $AC_I$ flows, and the transformers $T_2$ and $T_4$ include a primary winding $L_{1\_2}$ and $L_{1\_4}$, respectively, through which the quadrature-phase clock signal $AC_Q$ flows. The transformers $T_1$ and $T_3$ provide inductive coupling of the in-phase clock signal $AC_I$ to the JTL 264, and the transformers $T_2$ and $T_4$ provide inductive coupling of the quadrature-phase clock signal $AC_Q$ to the JTL 264. Therefore, the first transformer $T_1$ generates a bias current $I_{B1}$ via a secondary winding $L_{2\_1}$ and the third transformer $T_3$ generates a bias current $I_{B3}$ via a secondary winding $L_{2\_3}$ in response to the in-phase clock signal $AC_I$. Similarly, the second transformer $T_2$ generates a bias current $I_{B2}$ via a secondary winding $L_{2\_2}$ and the fourth transformer $T_4$ generates a bias current $I_{B4}$ via a secondary winding $L_{2\_4}$ in response to the quadrature-phase clock signal $AC_Q$.

Therefore, based on delay devices 262 each being arranged as the JTL 264, the scan path 258 propagates the data stream DS to provide scan data $SC_Z$. As an example, the scan data $SC_Z$ corresponds to scan data that is provided to another wave-pipeline scanning system, such that another scan point device selects between the input data (e.g., the data $DT_Z$) and the scan data $SC_Z$ in response to the mode signal SC_EN. Accordingly, as an example, the scanning of the data streams is performed in a substantially similar manner in RQL circuits, as described herein.

It is to be understood that the wave-pipeline scanning system 250 is not intended to be limited to the example of FIG. 5. For example, while the wave-pipeline scanning system 250 demonstrates delay elements 262 that are configured as JTLs 264, it is to be understood that other types of delay elements are possible, such as passive transmission line (PTL) devices, RQL D flip-flops, buffers (e.g., circular buffers), or any of a variety of other types of delay devices. Additionally, the JTL 264 is not limited to being biased based on the arrangement of transistors $T_1$ through $T_4$, but could instead implement other biasing arrangements (e.g., delta or wye-biasing arrangements). Therefore, the wave-pipeline scanning system 250 can be configured in a variety of ways.

In view of the foregoing structural and functional features described above, a methodology in accordance with various aspects of the present invention will be better appreciated with reference to FIG. 6. While, for purposes of simplicity of explanation, the methodology of FIG. 6 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 6 illustrates an example of a method 300 for monitoring data in a circuit system (e.g., the circuit system 10). At 302, each of a plurality of data sequences (e.g., the respective input data $DT_Y$ and scan data $SC_Y$) are provided to a respective one of a plurality of scan paths (e.g., the scan paths 14) and a respective plurality of inputs of a wave-pipelined combinational logic circuit (e.g., the wave-pipelined combinational logic circuit 12) via a respective plurality of scan point devices (e.g., the scan point devices 16), the wave-pipelined combinational logic circuit comprising at least one logic gate between an input node (e.g., the input node 58) and at least one output node and configured to perform logic operations on a data sequence received at the input node. At 304, logic operations are performed on each of the plurality of data sequences via each of the wave-pipelined combinational logic circuit. At 306, each of the plurality of scan point devices is switched from a normal operating mode to a scan mode in response to a mode signal (e.g., the mode signal SC_EN). At 308, a serial data stream (e.g., the data stream DS) corresponding to the plurality of data sequences is propagated through each of the plurality of scan paths via each of the respective plurality of scan point devices and from a scan output of the circuit system. At 310, values of the plurality of data sequences at a given clock-cycle of a clock signal are analyzed based on the serial data stream via a logic monitoring system (e.g., the logic monitoring system 18) connected to the scan output.

In view of the foregoing structural and functional description, those skilled in the art will appreciate that portions of the systems and method disclosed herein may be embodied as a method, data processing system, or computer program product such as a non-transitory computer readable medium. Accordingly, these portions of the approach disclosed herein may take the form of an entirely hardware embodiment, an entirely software embodiment (e.g., in a non-transitory machine readable medium), or an embodiment combining software and hardware. Furthermore, portions of the systems and method disclosed herein may be a computer program product on a computer-usable storage medium having computer readable program code on the medium. Any suitable computer-readable medium may be utilized including, but not limited to, static and dynamic storage devices, hard disks, optical storage devices, and magnetic storage devices.

Certain embodiments have also been described herein with reference to block illustrations of methods, systems, and computer program products. It will be understood that blocks of the illustrations, and combinations of blocks in the illustrations, can be implemented by computer-executable instructions. These computer-executable instructions may be provided to one or more processors of a general purpose computer, special purpose computer, or other programmable data processing apparatus (or a combination of devices and circuits) to produce a machine, such that the instructions, which execute via the one or more processors, implement the functions specified in the block or blocks.

These computer-executable instructions may also be stored in computer-readable memory that can direct a computer or other programmable data processing apparatus to function in a particular manner, such that the instructions stored in the computer-readable memory result in an article of manufacture including instructions which implement the function specified in the flowchart block or blocks. The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions specified in the flowchart block or blocks.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A circuit system comprising:
   a wave-pipelined combinational logic circuit comprising at least one logic gate between an input node and at least one output node and configured to perform logic operations on a data sequence received at the input node;
   a scan path connected to the input node and comprising at least one delay element configured to propagate the data sequence from the input to a scan path output to capture values of the data sequence provided to the wave-pipelined combinational logic circuit as a serial data stream; and
   a scan point device configured to deliver one of input data and scan data as the data sequence to the wave-pipelined combinational logic circuit and to the scan path via the input node in a respective one of a normal operating mode and a scan mode.

2. The system of claim 1, wherein the scan path is a first scan path of a plurality of scan paths connected to respective inputs of the wave-pipelined combinational logic circuit, each of the plurality of scan paths comprising at least one delay element, and wherein the scan point device is a plurality of a scan point devices interconnecting the plurality of scan paths with the wave-pipelined combinational logic circuit, such that the plurality of scan paths are arranged in series in the scan mode via each of the respective plurality of scan point devices to form a scan chain through which the serial data stream is propagated between a system scan input and a system scan output associated with the circuit system to capture the values of the data sequence provided to the wave-pipelined combinational logic circuit.

3. The system of claim 2, wherein each of the plurality of scan paths comprises a plurality of delay elements sufficient in number that is greater than or equal to a largest number of pipeline stages from the input node to one of the at least one output node.

4. The system of claim 2, wherein each of the plurality of scan point devices comprises a multiplexer comprising a first input connected to an output of the wave-pipelined combinational logic circuit and configured to receive the input data and a second input connected to a respective scan path output of one of the plurality of scan paths and configured to receive the scan data, the multiplexer being configured to provide the data sequence as the input data in the normal operating mode and to provide the data sequence as the scan data in the scan mode based on a value of a mode signal.

5. The system of claim 2, wherein each of the at least one delay element in each of the plurality of scan paths has an associated delay of approximately one clock-cycle of a clock signal, such that each of the plurality of scan paths is configured to capture the values of each of the respective data sequences provided to each of a respective plurality of inputs to the wave-pipelined combinational logic circuit at a given clock-cycle.

6. The system of claim 2, wherein the clock signal is provided continuously to the circuit system, such that the circuit system is configured to toggle between the normal operating mode and the scan mode without interruption of the clock signal to provide a scan of the circuit system at full speed.

7. The system of claim 2, wherein the serial data stream is output from the system scan output to a logic monitoring system configured to evaluate the serial data stream, wherein the system scan input is configured to receive the serial data stream provided from the logic monitoring system to restore the values of the data sequence provided to each of the respective plurality of inputs of the wave-pipelined combinational logic circuit at the given clock-cycle.

8. The system of claim 7, wherein the logic monitoring system is configured to provide a mode signal that is provided to each of the plurality of scan point devices, wherein the logic monitoring system is configured to facilitate a logic test by switching the circuit system from the scan mode to the normal operating mode via the mode signal for at least one clock-cycle in response to the values of the data sequence provided to the wave-pipelined combinational logic circuit being restored and by subsequently switching the circuit system from the normal operating mode to the scan mode via the mode signal to provide the serial data steam back to the logic monitoring system to capture the values of the data sequence provided to the wave-pipelined combinational logic circuit after operation of the wave-pipelined combinational logic circuit for the at least one clock-cycle.

9. The system of claim 7, wherein the logic monitoring system is configured to generate a predetermined serial test stream that is provided to the system scan input to provide the predetermined serial test stream as the data sequence to the wave-pipelined combinational logic circuit during the scan mode.

10. The system of claim 2, wherein the circuit system comprises at least one internal memory device that is disabled during the scan mode via the mode signal.

11. The system of claim 1, wherein the circuit system is configured as a Reciprocal Quantum Logic (RQL) circuit.

12. A computer readable medium that, when executed, is configured to implement a method for monitoring data in a circuit system, the method comprising:
providing each of a plurality of data sequences to a respective one of a plurality of scan paths and a respective plurality of inputs of a wave-pipelined combinational logic circuit via a respective plurality of scan point devices, the wave-pipelined combinational logic circuit comprising at least one logic gate between an input node and at least one output node and configured to perform logic operations on a data sequence received at the input node;
performing logic operations on each of the plurality of data sequences via the;
switching each of the plurality of scan point devices from a normal operating mode to a scan mode in response to a mode signal;
propagating a serial data stream corresponding to the plurality of data sequences through each of the plurality of scan paths via each of the respective plurality of scan point devices and from a system scan output of the circuit system; and
analyzing values of the plurality of data sequences at a given clock-cycle of a clock signal based on the serial data stream via a logic monitoring system connected to the scan output.

13. The medium of claim 12, further comprising providing the serial data stream from the logic monitoring system to a system scan input of the circuit system to restore values of the plurality of data sequences to the values of the plurality of data sequences at the given clock-cycle.

14. The medium of claim 13, further comprising:
switching each of the plurality of scan point devices from the scan mode to the normal operating mode in response to the mode signal;
switching each of the plurality of scan point devices from the normal operating mode to the scan mode in response to the mode signal after at least one subsequent clock-cycle of the clock signal;
propagating the serial data stream through each of the plurality of scan paths via each of the respective plurality of scan point devices and from the scan output of the circuit system based on the clock signal; and
analyzing the values of the data sequence associated with the wave-pipelined combinational logic circuit via the logic monitoring system.

15. The medium of claim 12, further comprising:
disabling memory associated with the circuit system in the scan mode;
generating a predetermined serial test stream, at least a portion of the predetermined serial test stream corresponding to predetermined test data associated with the memory; and
providing the predetermined serial test stream to a system scan input of the circuit system to provide the predetermined serial test stream as the respective data sequence to the wave-pipelined combinational logic circuit during the scan mode.

16. The medium of claim 12, wherein each of the plurality of scan paths comprises a plurality of delay elements sufficient in number that is greater than or equal to a largest number of pipeline stages from the input node to a respective one of the at least one output node.

17. The medium of claim 12, wherein the circuit system is configured as a Reciprocal Quantum Logic (RQL) circuit, the medium further comprising providing an AC clock signal to each of a plurality of Josephson Transmission Lines (JTLs) configured as delay elements in each of the plurality of scan paths.

18. A Reciprocal Quantum Logic (RQL) circuit system comprising:
a wave-pipelined combinational logic circuit comprising at least one RQL logic gate between one of a plurality of input nodes and at least one output and configured to perform logic operations on a data sequence of Single Flux Quantum (SFQ) pulses received at the input node;
a plurality of scan paths that are each connected to a respective one of the plurality of input nodes associated with the wave-pipelined combinational logic circuit; and
a plurality of scan point devices configured to provide one of input data and scan data as the data sequence to the respective wave-pipelined combinational logic circuit and to the respective plurality of scan paths in a respective one of a normal operating mode and a scan mode, such that the plurality of scan paths are coupled in series via the respective plurality of scan point devices in the scan mode to form a scan chain between a system scan input and a system scan output associated with the circuit system, the scan chain being configured to propagate a serial data stream through the circuit system corresponding to the data sequence provided to each of the plurality of inputs of the wave-pipelined combinational logic circuit to capture the values of the data sequence provided to the wave-pipelined combinational logic circuit.

19. The system of claim 18, wherein the serial data stream is output from the system scan output to a logic monitoring system configured to evaluate the serial data stream, wherein the system scan input is associated with a first of the plurality of scan point devices and is configured to receive the serial data stream provided from the logic monitoring system to restore values of the data sequence provided to the wave-pipelined combinational logic circuit to the values of the data sequence provided to the wave-pipelined combinational logic circuit.

20. The system of claim 19, wherein the logic monitoring system is configured to provide a mode signal that is provided to each of the plurality of scan point devices, wherein the logic monitoring system is configured to facilitate a logic test by switching the circuit system from the scan mode to the normal operating mode via the mode signal for at least one clock-cycle in response to the values of the data sequence provided to the wave-pipelined combinational logic circuit being restored and by subsequently switching the circuit system from the normal operating mode to the scan mode via the mode signal to provide the serial data steam back to the logic monitoring system to capture the values of the data sequence provided to the wave-pipelined combinational logic circuit after operation of the wave-pipelined combinational logic circuit for the at least one clock-cycle.

* * * * *